(12) United States Patent
Kubota et al.

(10) Patent No.: US 9,322,888 B2
(45) Date of Patent: Apr. 26, 2016

(54) POSITION DETECTION APPARATUS AND MANUFACTURING METHOD OF THE SAME

(71) Applicant: DENSO CORPORATION, Kariya, Aichi-pref. (JP)

(72) Inventors: Takamitsu Kubota, Chiryu (JP); Akitoshi Mizutani, Okazaki (JP); Yoshiyuki Kono, Obu (JP)

(73) Assignee: DENSO CORPORATION, Kariya (JP)

( * ) Notice: Subject to any disclaimer, the term of this patent is extended or adjusted under 35 U.S.C. 154(b) by 540 days.

(21) Appl. No.: 13/935,012

(22) Filed: Jul. 3, 2013

(65) Prior Publication Data

US 2014/0012537 A1    Jan. 9, 2014

(30) Foreign Application Priority Data

Jul. 5, 2012    (JP) ................. 2012-151374

(51) Int. Cl.
*G01D 5/12*  (2006.01)
*G01R 33/02*  (2006.01)
*G01R 3/00*  (2006.01)
*G01R 33/07*  (2006.01)

(52) U.S. Cl.
CPC  *G01R 33/02* (2013.01); *G01R 3/00* (2013.01); *G01R 33/072* (2013.01); *Y10T 29/49004* (2015.01)

(58) Field of Classification Search
CPC .................................. G01D 5/14; G01B 7/30
USPC ................. 324/207.25; 701/102; 702/151
See application file for complete search history.

(56) References Cited

U.S. PATENT DOCUMENTS

| | | | |
|---|---|---|---|
| 6,498,479 B1 | 12/2002 | Hamaoka et al. | |
| 2006/0152215 A1* | 7/2006 | Mizutani | ............... G01D 5/145 324/207.25 |
| 2006/0261804 A1* | 11/2006 | Itoh | ............... G01D 5/145 324/207.25 |
| 2007/0247143 A1* | 10/2007 | Ikeda | ............... F02D 9/105 324/207.25 |

FOREIGN PATENT DOCUMENTS

| | | |
|---|---|---|
| JP | 2004-264137 | 9/2004 |
| JP | 2012-112711 | 6/2012 |

OTHER PUBLICATIONS

Office Action (3 pages) dated Jun. 12, 2014, issued in corresponding Japanese Application No. 2012-151374 and English translation (5 pages).

\* cited by examiner

*Primary Examiner* — Lam Nguyen

(74) *Attorney, Agent, or Firm* — Nixon & Vanderhye PC (57) ABSTRACT

A position detection apparatus includes a magnetic generator, a magnetic detector, a storage, and a rotation angle calculator. The rotation angle calculator calculates a relative rotation angle of the magnetic generator with respect to the magnetic detector based on a voltage output from the magnetic detector and a relational expression of $\theta = \sin^{-1}((VH-c)/V_0)-b$. In the relational expression, the relative rotation angle is defined as $\theta$, the voltage output from the magnetic detector is defined as VH, a true maximum value of the voltage output from the magnetic detector is defined as $V_0$, a first true correction value is defined as b, and a second true correction value is defined as c.

7 Claims, 6 Drawing Sheets

POSITION DETECTION APPARATUS AND MANUFACTURING METHOD OF THE SAME

CROSS REFERENCE TO RELATED APPLICATION

This application is based on Japanese Patent Application No. 2012-151374 filed on Jul. 5, 2012, the disclosure of which is incorporated herein by reference.

TECHNICAL FIELD

The present disclosure relates to a position detection apparatus and a manufacturing method of the same.

BACKGROUND

In a conventional position detection apparatus, a magnetic element, such as a permanent magnet, or a magnetic detection element, such as a hall effect element, is equipped to a target. When the target whose rotation angle is to be detected starts to rotate, the magnetic detection element detects a magnetic flux density in order to detect the rotation angle of the target. For example, in a position detection apparatus disclosed in JP 3491577 B2 (corresponding to US 6498479 B1), a magnet is equipped to a shaft whose rotation angle to be detected. The shaft is also referred to as a target. When an output voltage from a hall effect element is defined as VH (unit: volt), and a maximum value of the output voltage from the hall effect element is defined as $V_0$ (unit: volt), the rotation angle $\theta$ (unit: degree) of the shaft is calculated by the following expression 1.

$$\theta = \sin^{-}(VH/V_0) \qquad \text{Expression 1}$$

In the above position detection apparatus, during an assembling process, the magnet and the hall effect element may be shifted from predetermined positions and a position shift may be generated between the hall effect element and the magnet. Thus, an accuracy of the rotation angle $\theta$ calculated by expression 1 may be degraded. In order to correct the positions of the magnet and the hall effect element, a position inspection process may be added to the assembling process. However, the number of processes is increased when the position inspection process is added.

SUMMARY

In view of the foregoing difficulties, it is an object of the present disclosure to provide a position detection apparatus in which a detection accuracy of a rotation angle of a target is improved with less number of manufacturing processes.

According to a first aspect of the present disclosure, a position detection apparatus includes a magnetic detector, a storage, and a rotation angle calculator. The magnetic detector outputs a voltage corresponding to a change of a magnetic flux density generated by a relative rotational movement between the magnetic detector and the magnetic generator. The storage stores a relational expression indicating a relationship between a relative rotation angle of the magnetic generator with respect to the magnetic detector and the voltage output from the magnetic detector. The rotation angle calculator is electrically coupled to the magnetic detector and the storage, and calculates the relative rotation angle of the magnetic generator with respect to the magnetic detector based on the voltage output from the magnetic detector and the relational expression stored in the storage. When the relative rotation angle of the magnetic generator with respect to the magnetic detector is defined as $\theta$, the voltage output from the magnetic detector corresponding to the relative rotation angle $\theta$ is defined as VH, a true maximum value of the voltage output from the magnetic detector is defined as $V_0$, a first true correction value that corrects a position shift of the magnetic generator with respect to the magnetic detector in a rotational direction of the relative rotational movement is defined as b, and a second true correction value that corrects a position shift of the magnetic generator with respect to the magnetic detector in a direction perpendicular to the rotational direction is defined as c, the relative rotation angle is calculated by the relational expression stored in the storage. The relational expression is indicated by expression 2 shown below. Expression 2 is converted from the following expression 3 indicating a relationship between the voltage output from the magnetic detector and the relative rotation angle.

$$\theta = \sin^{-1}((VH-c)/V_0)-b \qquad \text{Expression 2}$$

$$VH = V_0 \times \sin(\theta+b)+c \qquad \text{Expression 3}$$

The true maximum value, the first true correction value, and the second true correction value are calculated by the rotation angle calculator based on a first relative rotation angle, a first voltage, a second relative rotation, a second voltage defined as, and a third relative rotation angle. The magnetic detector outputs the first voltage when the relative rotation angle of the magnetic generator with respect to the magnetic detector is equal to the first relative rotation angle. The magnetic detector outputs the second voltage when the relative rotation angle of the magnetic generator with respect to the magnetic detector is equal to the second relative rotation angle. The magnetic detector outputs the voltage having a value of zero when the relative rotation angle of the magnetic generator with respect to the magnetic detector is equal to the third relative rotation angle.

With the above apparatus, a detection accuracy of a rotation angle of a target is improved by calculating the rotation angle with consideration of a position shift generated in an assembling process.

According to a second aspect of the present disclosure, a manufacturing method of the position detection apparatus according to the first aspect includes assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector, measuring the voltage output from the magnetic detector as the first voltage when the relative rotation angle of the magnetic generator with respect to the magnetic detector is equal to the first relative rotation angle, measuring the voltage output from the magnetic detector as the second voltage when the relative rotation angle of the magnetic generator with respect to the magnetic detector is equal to the second relative rotation angle, calculating the third relative rotation angle, under which the voltage output from the magnetic detector has a value of zero, by substituting the first relative rotation angle, the first voltage, the second relative rotation angle, and the second voltage to an expression of: $VH = \alpha \times \theta + \beta$ in which $\alpha$ indicates a first constant value and $\beta$ indicates a second constant value, calculating the true maximum value, the first true correction value b, and the second true correction value c, which are unknown values, by substituting the first relative rotation angle, the first voltage, the second relative rotation angle, the second voltage, and the third relative rotation angle to the relational expression, substituting the true maximum value, the first true correction value, and the second true correction value, which are calculated, to the relational expression, storing the relational expression in the storage.

With the above method, a detection accuracy of the rotation angle of the target is improved by calculating the rotation angle with consideration of a position shift generated in an assembling process and the number of manufacturing processes is reduced without performing a position inspection.

According to a third aspect of the present disclosure, a manufacturing method of the position detection apparatus according to the first aspect includes assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector, measuring the voltage output from the magnetic detector as the first voltage when the relative rotation angle of the magnetic generator with respect to the magnetic detector is equal to the first relative rotation angle, measuring the voltage output from the magnetic detector as the second voltage when the relative rotation angle of the magnetic generator with respect to the magnetic detector is equal to the second relative rotation angle, calculating the third relative rotation angle, under which the voltage output from the magnetic detector has a value of zero, by substituting the first relative rotation angle, the first voltage, the second relative rotation angle, and the second voltage to an expression of: $VH=FV1 \times \sin(\theta+b1)$ in which FV1 indicates a first tentative maximum voltage and b1 indicates a first tentative correction value, calculating the true maximum value, the first true correction value, and the second true correction value, which are unknown values, by substituting the first relative rotation angle, the first voltage, the second relative rotation angle, the second voltage, and the third relative rotation angle to the relational expression, substituting the true maximum value, the first true correction value, and the second true correction value, which are calculated, to the relational expression, and storing the relational expression in the storage.

With the above method, a detection accuracy of the rotation angle of the target is improved by calculating the rotation angle with consideration of a position shift generated in an assembling process and the number of manufacturing processes is reduced without performing a position inspection.

According to a fourth aspect of the present disclosure, a manufacturing method of the position detection apparatus according to the first aspect includes assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector, measuring the voltage output from the magnetic detector as the first voltage when the relative rotation angle of the magnetic generator with respect to the magnetic detector is equal to the first relative rotation angle, measuring the voltage output from the magnetic detector as the second voltage when the relative rotation angle of the magnetic generator with respect to the magnetic detector is equal to the second relative rotation angle, calculating the third relative rotation angle, under which the voltage output from the magnetic detector has a value of zero, by substituting the first relative rotation angle, the first voltage, the second relative rotation angle, and the second voltage to an expression of: $VH=FV2 \times \sin\theta+c1$ in which FV2 indicates a second tentative maximum voltage and c1 indicates a second tentative correction value, calculating the true maximum value, the first true correction value, and the second true correction value, which are unknown, by substituting the first relative rotation angle, the first voltage, the second relative rotation angle, the second voltage, and the third relative rotation angle to the relational expression, substituting the true maximum value, the first true correction value, and the second true correction value, which are calculated, to the relational expression, and storing the relational expression in the storage.

With the above method, a detection accuracy of the rotation angle of the target is improved by calculating the rotation angle with consideration of a position shift generated in an assembling process and the number of manufacturing processes is reduced without performing a position inspection.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The following will describe embodiments of the present disclosure with reference to the drawings.

First Embodiment

Figure 1:
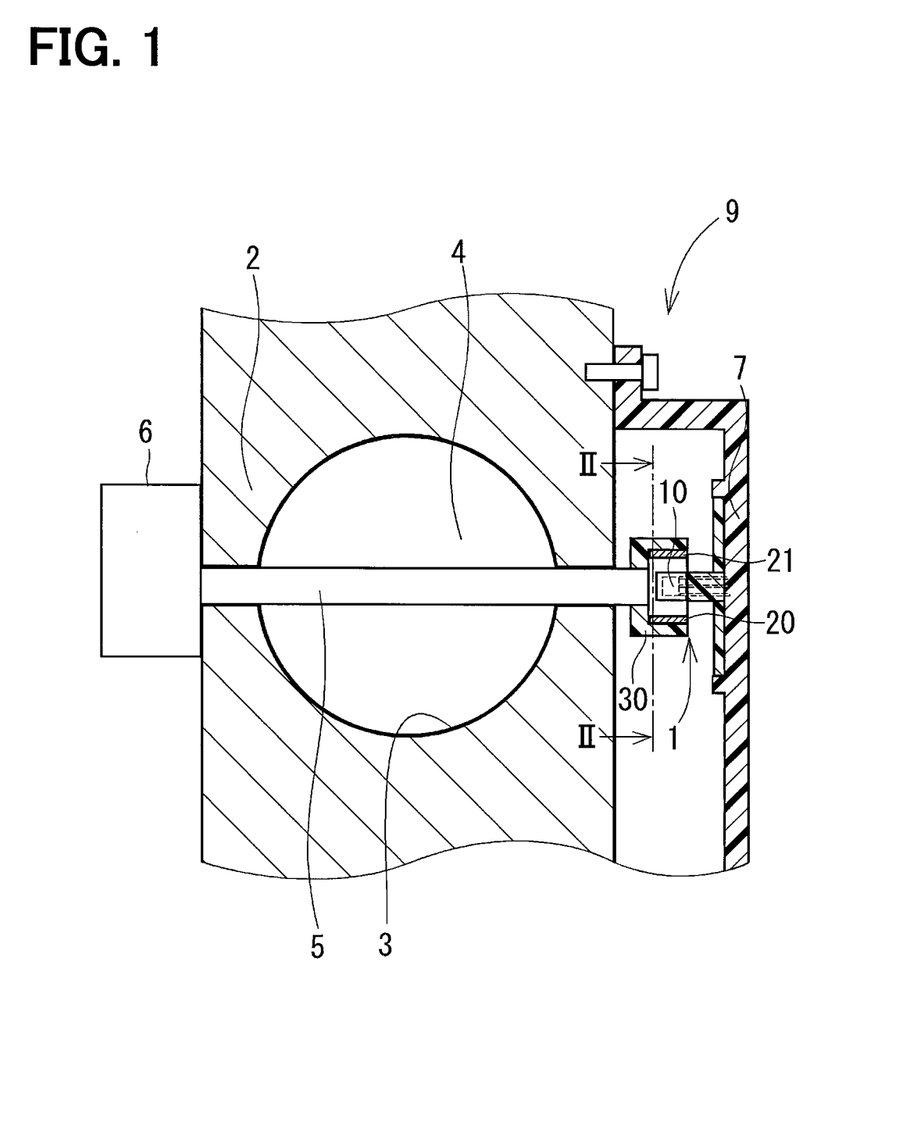
FIG. 1 is a diagram showing an electronically controlled throttle in which a position detection apparatus according to an embodiment of the present disclosure is employed.

The following will describe a position detection apparatus 1 according to a first embodiment of the present disclosure with reference to FIG. 1 to FIG. 5. The position detection apparatus 1 according to the present embodiment is used, for example, in an electronically controlled throttle 9, which controls an amount of air entering a cylinder of an internal combustion engine. As shown in FIG. 1, the electronically controlled throttle 9 includes a housing 2 and an inlet air passage 3 through which the air enters the internal combustion engine. Hereinafter, the electronically controlled throttle 9 is referred to as a throttle 9 for convenience. The throttle 9 further includes a valve 4 and a valve shaft 5. The valve 4 has a circular plate shape, and is arranged in the inlet air passage 3. The valve 4 is integrated with the valve shaft 5. Both ends of the valve shaft 5 are rotatably supported by the housing 2. With this configuration, the valve 4 is rotatable with the valve shaft 5 as a rotation axis.

Figure 2:
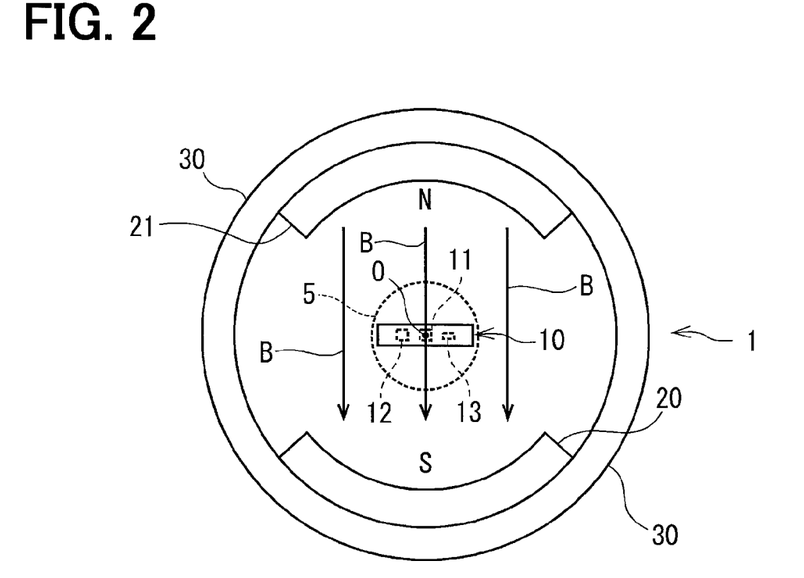
FIG. 2 is a diagram showing the position detection apparatus viewed from a line II-II in FIG. 1.

The position detection apparatus 1 includes permanent magnets 20, 21 and a hall integrated circuit (IC) 10, which includes a hall effect element and functions as a magnetic sensor. The permanent magnet 20, 21 function as a magnetic generator. The permanent magnets 20, 21 are equipped to one end of the valve shaft 5 via a yoke 30 having a cylindrical shape. The permanent magnet 20, 21 are arranged on an inner surface of the yoke 30. Further, the permanent magnet 20 is arranged 180 degrees opposite to the permanent magnet 21 in a radial direction of the yoke 30. In FIG. 2, magnetic flux generated by the two permanent magnets 20, 21 is shown by arrows B. The magnetic flux is in a direction approximately perpendicular to a rotation axis O of the yoke 30.

The hall IC 10 is arranged adjacent to a center point of an imaginary line that connects the permanent magnet 20 and the permanent magnet 21. The hall IC 10 is fixed to a base 7, which is arranged on an outer surface of the housing 2.

Figure 3:
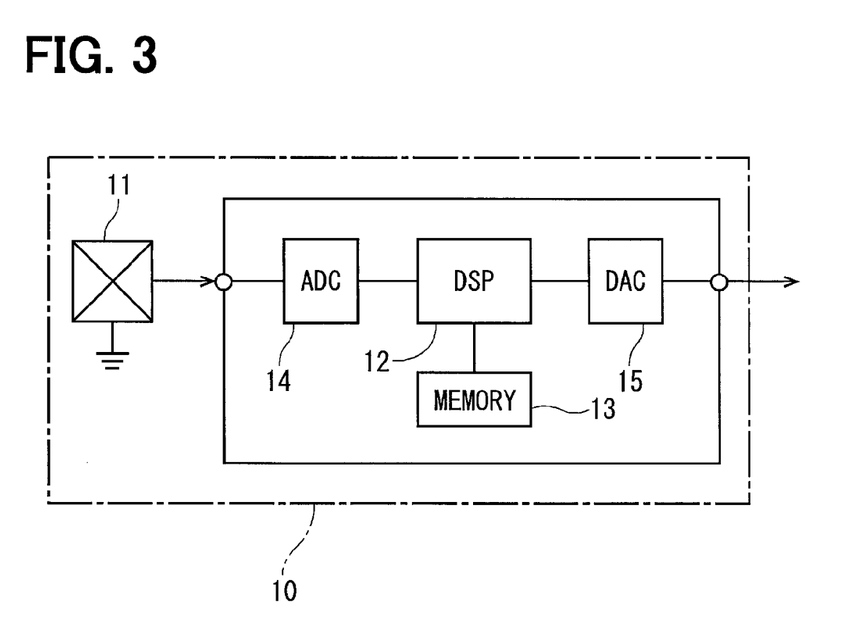
FIG. 3 is a circuit diagram showing a configuration of the position detection apparatus.

As shown in FIG. 3, the hall IC 10 is an integrated chip in which the hall effect element 11, an analog-to-digital converter (ADC) 14, a digital signal processor (DSP) 12, a digital-to-analog converter (DAC) 15, and a memory 13 are integrated. The hall effect element 11 functions as a magnetic detector, the DSP 12 functions as a rotation angle calculator, and the memory 13 functions as a storage. The hall IC 10 is arranged such that a surface of the hall effect element 11 through which the magnetic flux passes is arranged on a rotation axis of the yoke 30. Since the surface of the hall effect element 11 is sensitive to the magnetic flux, the surface is also referred to as a magnetic sensitive surface.

The hall effect element 11 is made of a semiconducting film. The hall effect element 11 outputs an analog signal corresponding to a change in a density of the magnetic flux generated between the permanent magnets 20, 21.

The ADC 14 converts the analog signal output from the hall effect element 11 to a digital signal. The DSP 12 calculates a relative rotation angle of the permanent magnet 20, 21 with respect to the hall effect element 11. The DAC 15 converts the digital signal output from the DSP 12 to an analog signal.

The memory 13 may be provided by a read only memory or a writable erasable memory. The DSP 12 further stores a relational expression between the output signal, which is a voltage signal, from the hall effect element 11 and the relative rotation angle of the permanent magnet 20, 21. The relational expression will be described later in detail.

In the throttle 9, when the valve shaft 5 rotates, the permanent magnets 20, 21 perform relative rotational movements with respect to the hall effect element 11. The hall IC 10 outputs the voltage signal corresponding to the density of the magnetic flux that passes through the magnetic sensitive surface of the hall effect element 11. The throttle 9 is coupled to an external electronic control device (not shown) by which the throttle 9 is controlled. The external electronic control device supplies a current to a motor 6 that drives the valve 4 such that an opening amount of the valve 4 is equal to a target opening amount. The opening amount of the valve 4 is calculated based on the voltage signal output from the hall IC 10, and the target opening amount is set corresponding to a movement state of the internal combustion engine. The opening amount of the valve 4 is controlled by the motor 6 so that the amount of air entering the internal combustion engine is controlled.

Figure 4:
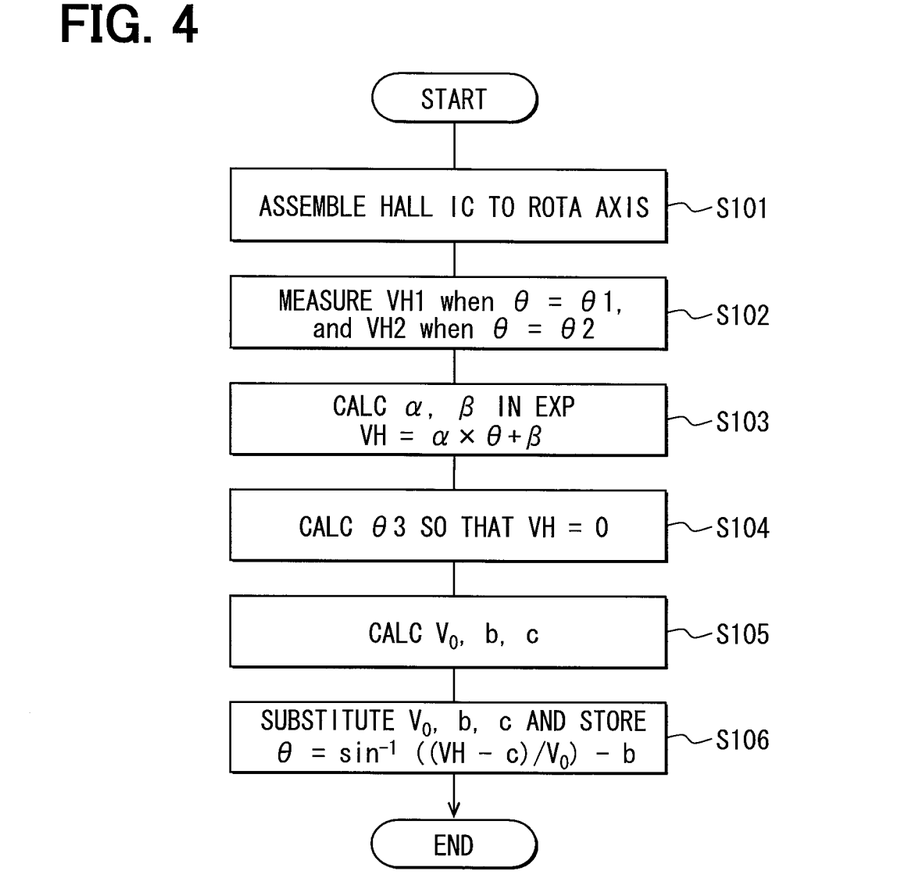
FIG. 4 is a flowchart showing a manufacturing process of a position detection apparatus according to a first embodiment of the present disclosure.

The following will describe a manufacturing method of the position detection apparatus 1 according to the present embodiment with reference to FIG. 4.

FIG. 4 is a flowchart showing a manufacturing process of the position detection apparatus 1 according to the present embodiment. At S101, the hall IC 10 is assembled to the base 7 along the rotation axis of the yoke 30. The hall IC 10 is arranged such that a first side and a second side of the hall effect element 11 face the respective permanent magnets 20, 21. As described above, the permanent magnets 20, 21 are arranged on the inner surface of the yoke 30.

At S102, the DSP 12 measures a first voltage VH1 (unit: volt) and a second voltage VH2 (unit: volt) output from the hall effect element 11. The first voltage VH1 corresponds to a first relative rotation angle $\theta 1$ (unit: degree) of the permanent magnet 20 with respect to the hall effect element 11, and the second voltage VH2 corresponds to a second relative rotation angle $\theta 2$ (unit: degree) of the permanent magnet 21 with respect to the hall effect element 11. Specifically, the first voltage VH1 and the second voltage VH2 are measured when the yoke 30 is tentatively arranged such that the relative rotation angle of the permanent magnet 20 with respect to the hall effect element 11 is set to the first relative rotation angle $\theta 1$ and the relative rotation angle of the permanent magnet 21 with respect to the hall effect element 11 is set to the second relative rotation angle $\theta 2$. Then, the DSP 12 measures the first voltage VH1 and the second voltage VH2, which are output from the hall effect element 11 and converted by the ADC 14.

At S103, the first voltage VH1 corresponding to the first relative rotation angle $\theta 1$ and the second voltage VH2 corresponding to the second relative rotation angle $\theta 2$ are substituted in the following expression 4. In expression 4, alpha ($\alpha$), which is also referred to as a first constant value, indicates a slope of a straight line, and beta ($\beta$), which is also referred to as a second constant value, indicates an x-intercept of the straight line. Expression 5 is obtained when the first voltage VH1 and the first relative rotation angle $\theta 1$ are substituted in expression 4. Expression 6 is obtained when the second voltage VH2 and the second relative rotation angle $\theta 2$ are substituted in expression 4.

$$VH = \alpha \times \theta + \beta \qquad \text{Expression 4}$$

$$VH1 = \alpha \times \theta 1 + \beta \qquad \text{Expression 5}$$

$$VH2 = \alpha \times \theta 2 + \beta \qquad \text{Expression 6}$$

Figure 5:
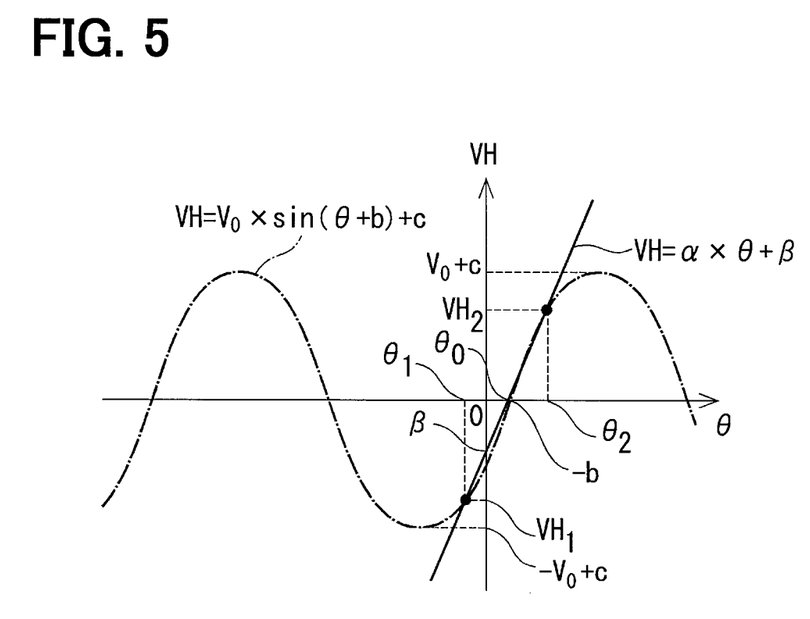
FIG. 5 is a diagram showing a calculation method of a rotation angle performed by the position detection apparatus according to the first embodiment.

The following expression 7 indicates a relationship between the output voltage VH of the hall effect element 11 and the relative rotation angle $\theta$ of the permanent magnet 20, 21 with respect to the hall effect element 11. As shown in FIG. 5, expression 4 indicates a straight line that passes through two points on a graph that corresponds to expression 7. In expression 4, when a slope of the straight line has a value of $\alpha$ and the relative rotation angle $\theta$ has a value of zero, a value of the output voltage VH is defined as the intercept $\beta$. In FIG. 5, a graph showing the relationship between the output voltage VH and the rotation angle $\theta$ defined by expression 7 is illustrated by a dashed-dotted line. FIG. 5 further shows a true maximum value $V_0$ (unit: volt) of the output voltage VH, a first true correction value b (unit: degree) and a second true correction value c (unit: volt). Expression 7 is converted from expression 12, which will be described later.

$$VH = V_0 \times \sin(\theta + b) + c \qquad \text{Expression 7}$$

The true maximum value $V_0$ is a maximum value of the output voltage VH from the hall effect element 11 when the permanent magnets 20, 21 have no position shifts with respect to the hall effect element 11 in a circumferential direction of the yoke 30 and in the radial direction of the yoke 30. Hereinafter, the circumferential direction of the yoke 30, which is equal to a rotational direction of the relative rotation movement between the permanent magnets 20, 21 and the hall effect element 11, is referred to as a circumferential direction. The radial direction of the yoke 30, which is perpendicular to the rotational direction of the relative rotation movement, is referred to as a radial direction. Further, the first true correction value b is a value that corrects a position shift of the permanent magnet 20, 21 with respect to the hall effect element 11 in the circumferential direction. Specifically, the first true correction value b indicates a slope of a line that connects a center point of the permanent magnet 20 and a center point of the permanent magnet 21 with respect to the magnetic sensitive surface of the hall effect element 11. Further, the second true correction value c is a value that corrects a position shift of the permanent magnet 20, 21 with respect to the hall effect element 11 in the radial direction. Specifically, the second true correction value c indicates a distance from a rotation axis of the permanent magnets 20, 21 to a center of the hall effect element 11. That is, the second true correction value c indicates a distance between the rotation axis of the yoke 30 to the center of the hall effect element 11. At S103, the true maximum value $V_0$, the first true correction value b, and the second true correction value c are unknown values.

At S104, the DSP 12 assigns values calculated at S103 to the slope α and the intercept β. Then, the DSP 12 calculates a third relative rotation angle θ3 under which the output voltage VH has a value of zero. The third relative rotation angle θ3 is calculated by the following expression 8.

$$\theta_3 = \frac{-(\theta_2 - \theta_1) \times VH_1 + (VH_2 - VH_1) \times \theta_1}{VH_2 - VH_1} \quad \text{Expression 8}$$

At S105, the DSP 12 substitutes the first relative rotation angle θ1 and the first voltage VH1 in expression 7, and obtains the following expression 10. Further, the DSP 12 substitutes the second relative rotation angle θ2 and the second voltage VH2 in expression 7, and obtains the following expression 11. Further, the DSP 12 substitutes the third relative rotation angle θ3 in expression 7, and obtains the following expression 9. Based on expression 9, expression 10, and expression 11, the DSP 12 calculates the true maximum value $V_0$, the first true correction value b, and the second true correction value c.

$$0 = V_0 \times \sin(\theta_3 + b) + c \quad \text{Expression 9}$$

$$VH1 = V_0 \times \sin(\theta_1 + b) + c \quad \text{Expression 10}$$

$$VH2 = V_0 \times \sin(\theta_2 + b) + c \quad \text{Expression 11}$$

At S106, the DSP 12 obtains the relational expression between the rotation angle θ of the permanent magnet 20, 21 and the output voltage VH from the hall effect element 11 by substituting the calculated true maximum value $V_0$, the calculated first true correction value b, and the calculated second true correction value c in expression 12. Then, the DSP 12 stores expression 12 whose unknown values $V_0$, b, c are assigned by the values calculated at S105, in the memory 13. Hereinafter, expression 12 whose unknown values $V_0$, b, c are assigned by the values calculated at S105 is also referred to as the relational expression 12.

$$\theta = \sin^{-1}((VH - c)/V_0) - b \quad \text{Expression 12}$$

The following will describe an operation of the position detection apparatus 1. In the position detection apparatus 1, when the valve shaft 5 of the valve 4 rotates, the yoke 30 rotates with the valve shaft 5. The direction of the magnetic flux generated by the permanent magnets 20, 21, which are assembled to the yoke 30, changes with a rotational movement of the valve shaft 5. Thus, the output voltage VH, which is output from the hall effect element 11 and is converted by the ADC 14, changes with the rotational movement of the valve shaft 5.

The DSP 12 substitutes the output voltage VH from the hall effect element 11 in the relational expression (expression 12), and calculates the rotation angle θ. Then, the DSP 12 outputs the rotation angle θ to an external device (not shown) via the DAC 15.

The position detection apparatus 1 according to the first embodiment calculates the relative rotation angle θ of the permanent magnet 20, 21 with respect to the hall effect element 11 based on the relational expression (expression 12). The relational expression indicates a relationship between the relative rotation angle θ and the output voltage VH from the hall effect element 11 with consideration of the position shift generated between the permanent magnet 20, 21 and the hall effect element 11. The position shift generated between the permanent magnet 20, 21 and the hall effect element 11 negatively affects an accuracy of the calculated relative rotation angle θ. When the positions of the permanent magnet 20, 21 and the hall effect element 11 are shifted in the circumferential direction, the rotation angle detected by the hall effect element 11 is different from an actual rotation angle of the valve shaft 5. Further, when the positions of the permanent magnet 20, 21 and the hall effect element 11 are shifted in the radial direction and the output voltage of the hall effect element 11 is zero, an actual rotation angle of the valve shaft 5 has a value other than zero. The position detection apparatus 1 according to the present embodiment corrects the relationship between the relative rotation angle θ and the output voltage VH with the first true correction value b and the second true correction value c. Thus, in the position detection apparatus 1 according to the present embodiment, a detection accuracy of the rotation angle θ of the permanent magnet 20, 21 with respect to the hall effect element 11 is improved.

Further, in the position detection apparatus 1 according to the present embodiment, the true maximum value $V_0$, the first true correction value b, and the second true correction value c are calculated based on the first voltage VH1, the second voltage VH2, the first relative rotation angle θ1, and the second relative rotation angle θ2. That is, in FIG. 5, a straight-line approximation is employed using the two points, which are located on the graph corresponding to expression 7 and have the respective voltages of VH1 and VH2. Then, the true maximum value $V_0$, the first true correction value b, and the second true correction value c are calculated based on the detection results of the two points on the graph corresponding to expression 7. With this configuration, the detection accuracy of the rotation angle of the permanent magnet 20, 21 with respect to the hall effect element 11 is improved.

Second Embodiment

Figure 6:
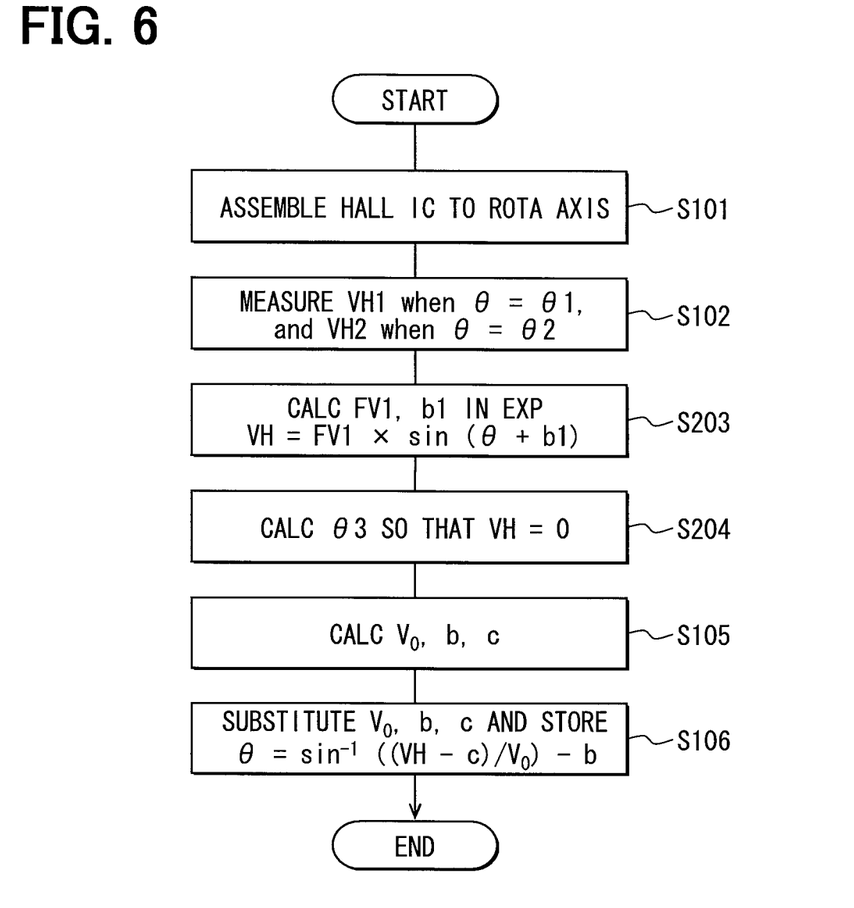
FIG. 6 is a flowchart showing a manufacturing process of a position detection apparatus according to a second embodiment of the present disclosure.

The following will describe a position detection apparatus 1 according to a second embodiment of the present disclosure with reference to FIG. 6. In the position detection apparatus 1 according to the present embodiment, a calculation method of the third relative rotation angle θ3 is different from the first embodiment. In the present embodiment, the same reference number or symbol is added to the same or equivalent parts, and a description of the similar part to the first embodiment will be omitted.

FIG. 6 is a flowchart showing a manufacturing method of the position detection apparatus 1 according to the present embodiment. In FIGS. 6, S101 and S102 are similar to S101 and S102 in FIG. 4. At S203, the DSP 12 substitutes the first relative rotation angle θ1 and the first voltage VH1 in expression 13, and obtains expression 14. Further, the DSP 12 substitutes the second relative rotation angle θ2 and the second voltage VH2 in expression 13, and obtains expression 15.

Then, the DSP 12 calculates a tentative maximum voltage FV1 (unit: volt) and a first tentative correction value b1 (unit: degree) based on expression 14 and expression 15.

$$VH = FV1 \times \sin(+b1) \quad \text{Expression 13}$$

$$VH1 = FV1 \times \sin(\theta_1 + b1) \quad \text{Expression 14}$$

$$VH2 = FV1 \times \sin(\theta_2 + b1) \quad \text{Expression 15}$$

Specifically, the tentative maximum voltage FV1 is calculated by the following expression 16, and the first tentative correction value b1 is calculated by the following expression 17.

$$FV1 = \frac{VH_1}{\sin\left[-\tan^{-1}\left\{\frac{-VH_1 \times \sin(\theta_{2\_}\theta_1)}{VH_2 - VH_1 \times \cos(\theta_{2\_}\theta_1)}\right\}\right]} \quad \text{Expression 16}$$

$$b1 = -\theta_1 - \tan^{-1}\left\{\frac{-VH_1 \times \sin(\theta_{2\_}\theta_1)}{VH_2 - VH_1 \times \cos(\theta_{2\_}\theta_1)}\right\} \quad \text{Expression 17}$$

At S204, the DSP 12 calculates a third relative rotation angle θ3 under which the output voltage VH has a value of zero based on the tentative maximum voltage FV1 and the first tentative correction value b1 calculated at S204. Specifically, the third relative rotation angle θ3 is calculated by the following expression 18.

$$\theta_3 = \theta_1 + \tan^{-1}\left\{\frac{-VH_1 \times \sin(\theta_{2\_}\theta_1)}{VH_2 - VH_1 \times \cos(\theta_{2\_}\theta_1)}\right\} \quad \text{Expression 18}$$

At S105, the DSP 12 substitutes the first relative rotation angle θ1 and the first voltage VH1 in the following expression 19 that is equal to expression 7, and obtains the following expression 21. Further, the DSP 12 substitutes the second relative rotation angle θ2 and the second voltage VH2 in the following expression 19, and obtains the following expression 22. Further, the DSP 12 substitutes the third relative rotation angle θ3 in the following expression 19, and obtains the following expression 20. Based on expression 20, expression 21, and expression 22, the DSP 12 calculates the true maximum value $V_0$, the first true correction value b, and the second true correction value c. Expression 19 is converted from expression 23, which will be described later.

$$VH = V_0 \times \sin(\theta + b) + c \quad \text{Expression 19}$$

$$0 = V_0 \times \sin(\theta_3 + b) + c \quad \text{Expression 20}$$

$$VH1 = V_0 \times \sin(\theta_1 + b) + c \quad \text{Expression 21}$$

$$VH2 = V_0 \times \sin(\theta_2 + b) + c \quad \text{Expression 22}$$

At S106, the DSP 12 obtains the relational expression between the rotation angle θ of the permanent magnet 20, 21 and the output voltage VH from the hall effect element 11 by substituting the calculated true maximum value $V_0$, the calculated first true correction value b, and the calculated second true correction value c in expression 23. Then, the DSP 12 stores expression 23 whose unknown values $V_0$, b, c are assigned by the values calculated at S105, in the memory 13. Hereinafter, expression 23 whose unknown values $V_0$, b, c are assigned by the values calculated at S105 is also referred to as the relational expression.

$$\theta = \sin^{-1}((VH - c)/V_0) - b \quad \text{Expression 23}$$

In the position detection apparatus 1 according to the present embodiment, the first tentative correction value b1 and the tentative maximum voltage FV1, which correct a position shift generated between the permanent magnet 20, 21 and the hall effect element 11 in the circumferential direction, are calculated at first based on expression 13, which is similar to expression 7 in the first embodiment. Then, the third relative rotation angle θ3 under which the output voltage VH has a value of zero is calculated. In the present embodiment, expression 13 includes a sine function. Thus, the true maximum value $V_0$, the first true correction value b, and the second true correction value c calculated in the present embodiment have less calculation errors compared with the true maximum value $V_0$, the first true correction value b, and the second true correction value c calculated based on straight-line approximation in the first embodiment. Thus, the detection accuracy of the relative rotation angle θ is further improved compared with the first embodiment. Further, other advantages provided by the position detection apparatus 1 according to the first embodiment are also provided by the position detection apparatus 1 according to the present embodiment.

The following will describe a modification example of the present embodiment. When the first tentative correction value b1 has a value around zero, that is, the slope of the line that connects the center of the permanent magnet 20 and the center of the permanent magnet 21 with respect to the magnetic sensitive surface of the hall effect element 11 is small, it becomes sin (b1)=0 and cos (b1)=1. Thus, the tentative maximum voltage FV1 may be calculated by the following expression 24, and the first tentative correction value b1 may be calculated by the following expression 25.

$$FV1 = \frac{VH_1 \times \cos\theta_2 - VH_2 \times \cos\theta_1}{\sin(\theta_1 - \theta_2)} \quad \text{Expression 24}$$

$$b1 = \frac{VH_2 \times \sin\theta_1 - VH_1 \times \sin\theta_2}{VH_1 \times \cos\theta_2 - VH_2 \times \cos\theta_1} \quad \text{Expression 25}$$

Further, the third relative rotation angle θ3 under which the output voltage has a value of zero is calculated by expression 26.

$$\theta_3 = -\frac{VH_2 \times \sin\theta_1 - VH_1 \times \sin\theta_2}{VH_1 \times \cos\theta_2 - VH_2 \times \cos\theta_1} \quad \text{Expression 26}$$

In the modification example of the present embodiment, the detection accuracy of the relative rotation angle θ is further improved compared with the first embodiment. Further, other advantages provided by the position detection apparatus 1 according to the first embodiment are also provided by the position detection apparatus 1 according to the modification example of the present embodiment.

Third Embodiment

Figure 7:
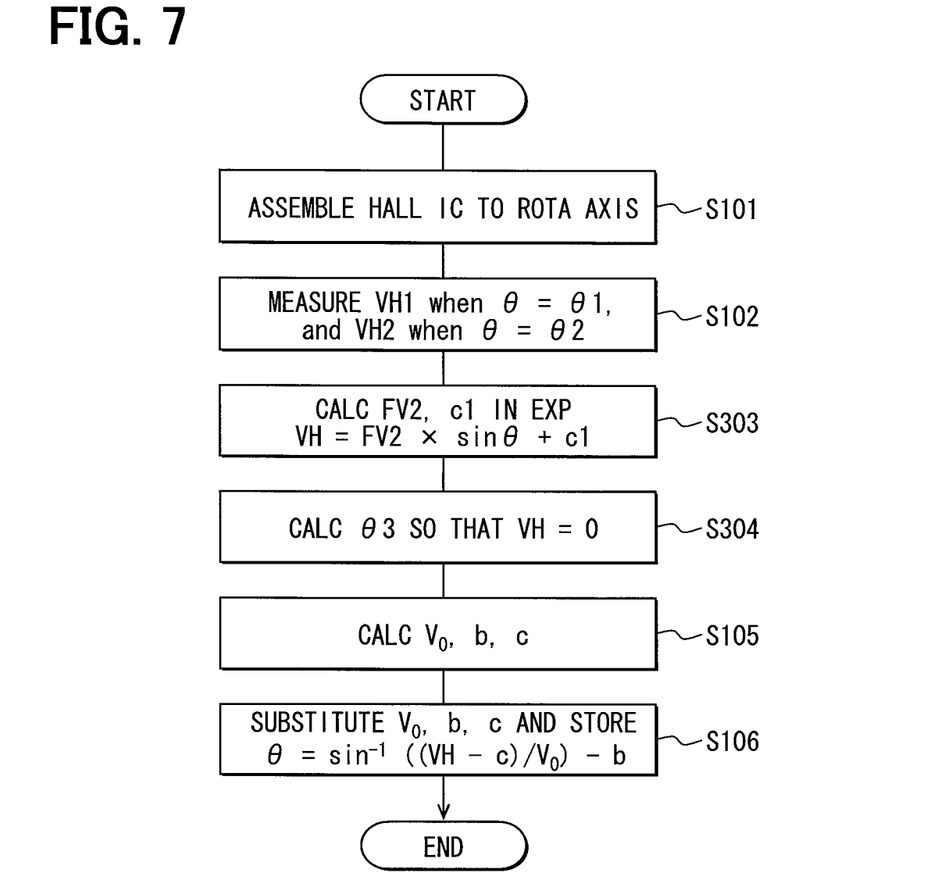
FIG. 7 is a flowchart showing a manufacturing process of a position detection apparatus according to a third embodiment of the present disclosure.

The following will describe a position detection apparatus 1 according to a third embodiment of the present disclosure with reference to FIG. 7. In the position detection apparatus 1 according to the present embodiment, a calculation method of the third relative rotation angle θ3 is different from the first embodiment. In the present embodiment, the same reference number or symbol is added to the same or equivalent parts, and a description of the similar part to the first embodiment will be omitted.

FIG. 7 is a flowchart showing a manufacturing method of the position detection apparatus 1 according to the present embodiment. In FIGS. 7, S101 and S102 are similar to S101 and S102 in FIG. 4. At S303, the DSP 12 substitutes the first relative rotation angle θ1 and the first voltage VH1 in expression 27, and obtains expression 28. Further, the DSP 12 substitutes the second relative rotation angle θ2 and the second voltage VH2 in expression 27, and obtains expression 29. Then, the DSP 12 calculates a tentative maximum voltage FV2 (unit: volt) and a second tentative correction value c1 (unit: degree) based on expression 28 and expression 29.

$$VH = FV2 \times \sin\theta + c1 \qquad \text{Expression 27}$$

$$VH1 = FV2 \times \sin\theta1 + c1 \qquad \text{Expression 28}$$

$$VH2 = FV2 \times \sin\theta2 + c1 \qquad \text{Expression 29}$$

Specifically, the tentative maximum voltage FV2 is calculated by the following expression 30, and the second tentative correction value c1 is calculated by the following expression 31.

$$FV2 = \frac{VH_2 - VH_1}{\sin\theta_2 - \sin\theta_1} \qquad \text{Expression 30}$$

$$c1 = VH_1 - \frac{VH_2 - VH_1}{\sin\theta_2 - \sin\theta_1} \times \sin\theta_1 \qquad \text{Expression 31}$$

At S304, the DSP 12 calculates a third relative rotation angle θ3 under which the output voltage has a value of zero based on the tentative maximum voltage FV2 and the second tentative correction value c1 calculated at S304. Specifically, the third relative rotation angle θ3 is calculated by the following expression 32.

$$\theta_3 = \sin^{-1}\left\{\frac{VH_1 - \frac{VH_2 - VH_1}{\sin\theta_2 - \sin\theta_1} \times \sin\theta_1}{\frac{VH_2 - VH_1}{\sin\theta_2 - \sin\theta_1}}\right\} \qquad \text{Expression 32}$$

At S105, the DSP 12 substitutes the first relative rotation angle θ1 and the first voltage VH1 in expression 33 that is equal to expression 7, and obtains the following expression 35. Further, the DSP 12 substitutes the second relative rotation angle θ2 and the second voltage VH2 in expression 33, and obtains the following expression 36. Further, the DSP 12 substitutes the third relative rotation angle θ3 in expression 33, and obtains the following expression 34. Based on expression 34, expression 35, and expression 36, the DSP 12 calculates the true maximum value $V_0$, the first true correction value b, and the second true correction value c. Expression 33 is converted from expression 37, which will be described later.

$$VH = V_0 \times \sin(\theta + b) + c \qquad \text{Expression 33}$$

$$0 = V_0 \times \sin(\theta3 + b) + c \qquad \text{Expression 34}$$

$$VH1 = V_0 \times \sin(\theta1 + b) + c \qquad \text{Expression 35}$$

$$VH2 = V_0 \times \sin(\theta2 + b) + c \qquad \text{Expression 36}$$

At S106, the DSP 12 obtains the relational expression between the relative rotation angle θ of the permanent magnet 20, 21 and the output voltage VH from the hall effect element 11 by substituting the calculated true maximum value $V_0$, the calculated first true correction value b, and the calculated second true correction value c in expression 37. Then, the DSP 12 stores expression 37 whose unknown values $V_0$, b, c are assigned by the values calculated at S105, in the memory 13. Hereinafter, expression 37 whose unknown values $V_0$, b, c are assigned by the values calculated at S105 is also referred to as the relational expression.

$$\theta = \sin^{-1}((VH - c)/V_0) - b \qquad \text{Expression 37}$$

In the position detection apparatus 1 according to the present embodiment, the second tentative correction value c1 and the tentative maximum voltage FV2, which correct a position shift generated between the permanent magnet 20, 21 and the hall effect element 11 in the radial direction, are calculated at first based on expression 27, which is similar to expression 7 in the first embodiment. Then, the third relative rotation angle θ3 under which the output voltage VH has a value of zero is calculated. In the present embodiment, expression 27 includes a sine function. Thus, the true maximum value $V_0$, the first true correction value b, and the second true correction value c calculated in the present embodiment have less calculation errors compared with the true maximum value $V_0$, the first true correction value b, and the second true correction value c calculated based on straight-line approximation in the first embodiment. Thus, the detection accuracy of the relative rotation angle θ is further improved compared with the first embodiment. Further, other advantages provided by the position detection apparatus 1 according to the first embodiment are also provided by the position detection apparatus 1 according to the present embodiment.

Other Embodiments

In each of the foregoing embodiments, the permanent magnets 20, 21 rotate with respect to the hall effect element 11 that is fixed to the housing 2 via the base 7. Further, the hall effect element 11 may rotate with respect to fixed permanent magnets 20, 21.

In each of the foregoing embodiments, the position detection apparatus 1 is used in the electronically controlled throttle 9. Further, the position detection apparatus 1 may be used in a device or a mechanic structure other than the electronically controlled throttle 9.

In each of the foregoing embodiments, the hall effect element 11 is integrated with the DSP 12 in the hall IC 10 that is fixed to the base 7 of the housing 2. Further, the hall effect element 11 and the DSP 12 may be separately arranged. Further, the DSP 12 may be arranged separately from the hall IC 10. Further, the DSP 12 may be arranged separately from the base 7 of the housing 2.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:
1. A position detection apparatus comprising:
a magnetic generator;
a magnetic detector that outputs a voltage corresponding to a change of a magnetic flux density generated by a relative rotational movement between the magnetic detector and the magnetic generator;

a storage that stores a relational expression indicating a relationship between a relative rotation angle of the magnetic generator with respect to the magnetic detector and the voltage output from the magnetic detector; and a rotation angle calculator electrically coupled to the magnetic detector and the storage, the rotation angle calculator calculating the relative rotation angle of the magnetic generator with respect to the magnetic detector based on the voltage output from the magnetic detector and the relational expression stored in the storage, wherein, when the relative rotation angle of the magnetic generator with respect to the magnetic detector is defined as $\theta$, the voltage output from the magnetic detector corresponding to the rotation angle $\theta$ is defined as VH, a true maximum value of the voltage output from the magnetic detector is defined as $V_0$, a first true correction value that corrects a position shift of the magnetic generator with respect to the magnetic detector in a rotational direction of the relative rotational movement is defined as b, and a second true correction value that corrects a position shift of the magnetic generator with respect to the magnetic detector in a direction perpendicular to the rotational direction is defined as c, the relative rotation angle is calculated by the relational expression of: $\theta = \sin^{-1}((VH-c)/V_0)-b$, wherein, the true maximum value, the first true correction value, and the second true correction value are calculated by the rotation angle calculator based on a first relative rotation angle, a first voltage, a second relative rotation angle, a second voltage, and a third relative rotation angle, wherein the magnetic detector outputs the first voltage when the relative rotation angle of the magnetic generator with respect to the magnetic detector is equal to the first relative rotation angle, wherein the magnetic detector outputs the second voltage when the relative rotation angle of the magnetic generator with respect to the magnetic detector is equal to the second relative rotation angle, and wherein the magnetic detector outputs the voltage having a value of zero when the relative rotation angle of the magnetic generator with respect to the magnetic detector is equal to the third relative rotation angle.

2. The position detection apparatus according to claim 1, wherein the third relative rotation angle is calculated by the rotation angle calculator based on an expression of: $VH = \alpha \times \theta + \beta$, wherein $\alpha$ indicates a first constant value and $\beta$ indicates a second constant value, and wherein the first constant value and the second constant value are calculated based on the first relative rotation angle, the first voltage, the second relative rotation angle, and the second voltage using the expression of: $VH = \alpha \times \theta + \beta$.

3. The position detection apparatus according to claim 1, wherein the third relative rotation angle is calculated by the rotation angle calculator based on an expression of: $VH = FV1 \times \sin(\theta + b1)$, wherein FV1 indicates a first tentative maximum voltage and b1 indicates a first tentative correction value, and wherein the first tentative maximum voltage and the first tentative correction value are calculated based on the first relative rotation angle, the first voltage, the second relative rotation angle, and the second voltage using the expression of: $VH = FV1 \times \sin(\theta + b1)$.

4. The position detection apparatus according to claim 1, wherein the third relative rotation angle is calculated by the rotation angle calculator based on an expression of: $VH = FV2 \times \sin\theta + c1$, wherein FV2 indicates a second tentative maximum voltage and c1 indicates a second tentative correction value, and wherein the second tentative maximum voltage and the second tentative correction value are calculated based on the first relative rotation angle, the first voltage, the second relative rotation angle, and the second voltage using the expression of: $VH = FV2 \times \sin\theta + c1$.

5. A manufacturing method of the position detection apparatus according to claim 1 comprising:

assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector;

measuring the voltage output from the magnetic detector as the first voltage when the relative rotation angle of the magnetic generator with respect to the magnetic detector is equal to the first relative rotation angle;

measuring the voltage output from the magnetic detector as the second voltage when the relative rotation angle of the magnetic generator with respect to the magnetic detector is equal to the second relative rotation angle;

calculating the third relative rotation angle, under which the voltage output from the magnetic detector has a value of zero, by substituting the first relative rotation angle, the first voltage, the second relative rotation angle, and the second voltage to an expression of: $VH = \alpha \times \theta + \beta$ in which $\alpha$ indicates a first constant value and $\beta$ indicates a second constant value;

calculating the true maximum value, the first true correction value b, and the second true correction value c, which are unknown values, by substituting the first relative rotation angle, the first voltage, the second relative rotation angle, the second voltage, and the third relative rotation angle to the relational expression of: $\theta = \sin^{-1}((VH-c)/V_0)-b$;

substituting the true maximum value, the first true correction value, and the second true correction value, which are calculated, to the relational expression of: $\theta = \sin^{-1}((VH-c)/V_0)-b$; and storing the relational expression of: $\theta = \sin^{-1}((VH-c)/V_0)-b$ in the storage.

6. A manufacturing method of the position detection apparatus according to claim 1 comprising:

assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector;

measuring the voltage output from the magnetic detector as the first voltage when the relative rotation angle of the magnetic generator with respect to the magnetic detector is equal to the first relative rotation angle;

measuring the voltage output from the magnetic detector as the second voltage when the relative rotation angle of the magnetic generator with respect to the magnetic detector is equal to the second relative rotation angle;

calculating the third relative rotation angle, under which the voltage output from the magnetic detector has a value of zero, by substituting the first relative rotation angle, the first voltage, the second relative rotation angle, and the second voltage to an expression of: $VH=FV1\times\sin(\theta+b1)$ in which $FV1$ indicates a first tentative maximum voltage and $b1$ indicates a first tentative correction value;

calculating the true maximum value, the first true correction value, and the second true correction value, which are unknown values, by substituting the first relative rotation angle, the first voltage, the second relative rotation angle, the second voltage, and the third relative rotation angle to the relational expression of: $\theta=\sin^{-1}((VH-c)/V_O)-b$;

substituting the true maximum value, the first true correction value, and the second true correction value, which are calculated, to the relational expression of: $\theta=\sin^{-1}((VH\text{'}c)/V_O)-b$; and storing the relational expression of: $\theta=\sin^{-1}((VH-c)/V_O)-b$ in the storage.

7. A manufacturing method of the position detection apparatus according to claim 1 comprising:

assembling the magnetic detector and the magnetic generator so that the magnetic generator is rotatably movable with respect to the magnetic detector in a relative manner, the magnetic detector outputting the voltage corresponding to the relative rotation angle of the magnetic generator with respect to the magnetic detector;

measuring the voltage output from the magnetic detector as the first voltage when the relative rotation angle of the magnetic generator with respect to the magnetic detector is equal to the first relative rotation angle;

measuring the voltage output from the magnetic detector as the second voltage when the relative rotation angle of the magnetic generator with respect to the magnetic detector is equal to the second relative rotation angle;

calculating the third relative rotation angle, under which the voltage output from the magnetic detector has a value of zero, by substituting the first relative rotation angle, the first voltage, the second relative rotation angle, and the second voltage to an expression of: $VH=FV2\times\sin\theta+c1$ in which $FV2$ indicates a second tentative maximum voltage and $c1$ indicates a second tentative correction value;

calculating the true maximum value, the first true correction value, and the second true correction value, which are unknown, by substituting the first relative rotation angle, the first voltage, the second relative rotation angle, the second voltage, and the third relative rotation angle to the relational expression of: $\theta=\sin^{-1}((VH-c)/V_O)-b$;

substituting the true maximum value, the first true correction value, and the second true correction value, which are calculated, to the relational expression of: $\theta=\sin^{-1}((VH-c)/V_O)-b$; and storing the relational expression of: $\theta=\sin^{-1}((VH-c)/V_O)-b$ in the storage.

* * * * *